United States Patent
Deak et al.

(10) Patent No.: US 9,123,875 B2
(45) Date of Patent: Sep. 1, 2015

(54) THIN-FILM MAGNETORESISTANCE SENSING ELEMENT, COMBINATION THEREOF, AND ELECTRONIC DEVICE COUPLED TO THE COMBINATION

(75) Inventors: James Geza Deak, Zhangjiagang (CN); Songsheng Xue, Zhangjiagang (CN)

(73) Assignee: Multidimension Technology Co., Ltd. (CN)

( * ) Notice: Subject to any disclaimer, the term of this patent is extended or adjusted under 35 U.S.C. 154(b) by 0 days.

(21) Appl. No.: 13/978,355

(22) PCT Filed: Dec. 30, 2011

(86) PCT No.: PCT/CN2011/085090
§ 371 (c)(1),
(2), (4) Date: Jul. 3, 2013

(87) PCT Pub. No.: WO2012/092831
PCT Pub. Date: Jul. 12, 2012

(65) Prior Publication Data
US 2013/0277781 A1    Oct. 24, 2013

(30) Foreign Application Priority Data

Jan. 7, 2011   (CN) .......................... 2011 1 0002406
May 27, 2011   (CN) .......................... 2011 1 0141226

(51) Int. Cl.
*H01L 29/82* (2006.01)
*H01L 43/02* (2006.01)
*B82Y 25/00* (2011.01)
*G01R 33/09* (2006.01)

(52) U.S. Cl.
CPC .................. *H01L 43/02* (2013.01); *B82Y 25/00* (2013.01); *G01R 33/093* (2013.01)

(58) Field of Classification Search
CPC ....... H01L 43/08; H01L 27/22; H01L 43/065; G11C 11/16
USPC .................. 257/421–427, E29.323; 438/3; 365/157–158, 171–173; 360/324–326, 360/313
See application file for complete search history.

(56) References Cited

U.S. PATENT DOCUMENTS

| 2009/0034322 A1 | 2/2009 | Hung et al. | |
| 2010/0096716 A1* | 4/2010 | Ranjan et al. | 257/421 |
| 2012/0257449 A1* | 10/2012 | Agan et al. | 365/171 |
| 2012/0261777 A1* | 10/2012 | Shukh | 257/421 |

FOREIGN PATENT DOCUMENTS

| CN | 1947272 | 4/2007 |
| CN | 101162756 A | 4/2008 |

* cited by examiner

*Primary Examiner* — Jami M Valentine
(74) *Attorney, Agent, or Firm* — Schwegman Lundberg & Woessner, P.A.

(57) ABSTRACT

A thin film magnetoresistive sensor for detecting a magnetic field components perpendicular and parallel to the plane of the sensor substrate is disclosed. The sensing element comprises a free layer, a reference layer, and a spacer layer between the free layer and the reference layer. The easy-axis magnetization inherent to the material of the free layer is arranged to be perpendicular to the plane of the sensor substrate. The magnetization direction of the reference layer is confined to a direction parallel to the substrate plane. The reference layer consists of a ferromagnetic layer exchange coupled to an antiferromagnetic layer, or consists of a ferromagnetic layer having a higher coercive force than that of the free layer. The spacer layer is composed of an insulating material or a conductive material. The magnetoresistive sensor further includes an array of aforementioned sensing elements coupled to an electronic device to provide three-axis sensing.

8 Claims, 6 Drawing Sheets

THIN-FILM MAGNETORESISTANCE SENSING ELEMENT, COMBINATION THEREOF, AND ELECTRONIC DEVICE COUPLED TO THE COMBINATION

CROSS-REFERENCE TO A RELATED APPLICATIONS

This application is a 35 U.S.C. §371 national phase application of PCT/CN2011/085090, filed on Dec. 30, 2011, which claims priorities to a Chinese Patent Application No. 201110141226.X, filed on May. 27, 2011, and a Chinese Patent Application No. 201110002406.X, filed on Jan. 7. 2011 incorporated herein by reference in their entireties.

FIELD OF THE INVENTION

The present invention relates to the use of a series of magnetic tunnel junction (MTJ, Magnetic Tunnel Junction) sensing elements in a vector magnetic field measuring system.

BACKGROUND ART

Vector magnetic sensors have become increasingly popular for use as electronic compasses in consumer devices such as cellular phones and automobile navigation systems, and for various applications involving positioning and measurement. These devices need to consume little power and can be produced at low cost and in high volume for consumer electronics.

There are various means by which the magnetic signal could be detected for a vector magnetic sensor application, and of these, there are many magnetic sensing technologies that can be integrated into a semiconductor chip. These include Hall Effect Sensors or magnetoresistive sensors including anisotropic magnetoresistance (AMR, Anisotropic Magnetoresistance) and giant magnetoresistance (GMR, Giant Magnetoresistance). Hall Effect devices are comparatively expensive and lacking in resolution. They are generally sensitive to fields oriented perpendicular to the plane of the substrate onto which they are fabricated. AMR and GMR devices although they are relatively high-resolution devices, suffer from low signal amplitude and require careful attention to be paid to back-end electronics design, which increases system complexity and size and therefore increases cost. AMR and GMR sensors are generally sensitive to fields parallel to the plane of the substrate onto which they are deposited.

MTJ sensors detect the magnetic field through the use of the tunneling magnetoresistance (TMR, Tunneling Magnetoresistance) effect, offer small size, high resolution, and large signal amplitude. These features can be used to simplify electronics design, thereby lowering total system cost. Like AMR and GMR sensors, MTJ sensors are sensitive to fields parallel to the plane of the substrate onto which they are fabricated.

As with most semiconductor devices, the best means to achieve the low cost and mass production demands is to build the device on a single semiconductor substrate. Unfortunately, it is not an easy task to build a three axis vector magnetometer on a single chip as most of the common sensors only detect parallel or perpendicular field components. To solve this problem, two or more substrates are often aligned at right angles to each other, and then packaged together, but this unfortunately increases cost and size.

There are various techniques that have been disclosed to build two-axis sensors using all of the above mentioned sensing devices. Unfortunately, these techniques cannot measure the magnetic field component perpendicular to the plane of the substrate. Hall Effect devices have been built that provide all three axes through the use of permeable shields and sometimes through the use of a van der Pauw like technique for the in-plane components, but these devices are relatively high power and low sensitivity.

Another technique that has been proposed is to combine sensors that detect perpendicular components with those that detect parallel components, such as Hall Effect sensors with AMR, GMR, or MTJ sensors, but the difference in sensitivity, and possibly process incompatibility, makes this an unattractive solution.

SUMMARY OF THE INVENTION

The present invention discloses a method for making a MTJ sensor that is sensitive to fields applied perpendicular to the plane of the sensor substrate for use in a single chip integrated vector magnetometer system.

One aspect of the present invention provides a thin-film magnetoresistive sensor element for detecting a magnetic field component perpendicular to the plane of the. The sensing element includes a freelayer and a reference layer, which are separated by a spacer layer. The inherent easy-axis of said freelayer material is perpendicular to its plane of the substrate, but the magnetization of the freelayer is constrained to the direction parallel to the substrate plane. The direction of magnetization of the reference layer is coupled to an antiferromagnetic layer, or the reference layer is comprised of a ferromagnetic material with higher coercivity than the freelayer ferromagnetic material. The spacer layer may be made from an insulating material or a conductive material.

Another aspect of the present invention is to provide a plurality of said sensing elements, deposited onto the same substrate, wherein said sensing elements are patterned into a plurality of shapes, he sensing elements may inclined along two or more axes such that a plurality of sensing elements with different sensitivity to the applied magnetic field are formed.

A third aspect of the present invention is to provide a combination of said sensing element s with an electronic device used for the deconvolution of two or three orthogonal magnetic field components.

A fourth aspect of the present invention is to provide a thin-film magnetoresistive sensor element for detecting a magnetic field component perpendicular to the substrate, wherein this sensing element includes a free layer, a reference layer, and a spacer layer located between the freelayer and the reference layer. The easy axis of the freelayer ferromagnetic material is perpendicular to the plane of the substrate, but the direction of magnetization of the reference layer is constrained to a direction parallel to the substrate plane, by the use of shape anisotropy. The ferromagnetic material, the reference layer may have a higher coercivity than the freelayer ferromagnetic material, and the spacer layer is made of an insulating or electrically conductive material is made.

The fifth aspect of the present invention is to provide a combination of said sensing elements, deposited onto the same substrate, and formed into a plurality of shapes, such that each sensing element inclined along one of two or more axes with respect to the applied magnetic field, thereby producing an array of sensors or differing sensitivity.

A sixth aspect of the present invention is to combine said sensing elements to an electronic device used for the deconvolution of the varying response of the plurality of sensing elements into two or three orthogonal magnetic field components.

The seventh aspect of the present invention is to provide a thin-film magnetoresistive sensor element for detecting a magnetic field component perpendicular to the substrate, the sensing element includes a free layer, a first reference layer, an insulating layer disposed between said reference and free layers, a second reference layer, a second spacer layer located between the free layer and the second reference layer. The inherent easy axis of the freelayer material is perpendicular to the substrate; the magnetization direction of the first reference layer is limited to a direction parallel to the plane of the substrate, the first reference layer is composed of a ferromagnetic material having perpendicular anisotropy and shape anisotropy, the first reference layer has a higher coercivity than the freelayer; the direction of the magnetization of the second reference layer is opposite to the magnetization direction of the first reference layer; the second reference layer is composed of a ferromagnetic material with perpendicular anisotropy and shape anisotropy, and it has a higher coercivity than the freelayer; The first spacer layer made of an insulating material; the second spacer layer is made of a conductive material.

The eighth aspect of the present invention is to combine said sensing elements to an electronic device used for the deconvolution of the varying response of the plurality of sensing elements into two or three orthogonal magnetic field components.

A ninth aspect of the present invention is to combine said sensing elements to an electronic device used for the deconvolution of the varying response of the plurality of sensing elements into two or three orthogonal magnetic field components.

The present invention also provides several combinations of sensing element composition and arrays, wherein the arrays of sensor elements are deposited onto the same substrate and arranged around the high permeability ferromagnetic plate in different positions in order to decompose the applied magnetic field into different directions. The present invention correspondingly provides several electronic devices coupled with a combination of these sensing elements in order to deconvolute the response of the sensor arrays into a measure of the tree orthogonal components of the applied magnetic field.

DESCRIPTION OF THE PREFERRED EMBODIMENTS

Figure 1:
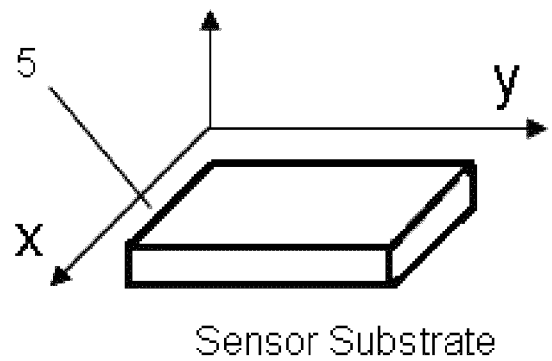
FIG. 1—Geometry of the sensor film showing the coordinate system.

FIG. 1 defines the coordinate system of the vector magnetometer (VM, vector magnetometer). Here a magnetic sensor is deposited on a substrate 5 that lies in the XY plane. The X and Y coordinates are referred to as in-plane or parallel to the plane of the substrate directions, and the Z-axis represents the perpendicular to the surface of the substrate direction.

The preferred sensor for application in the present invention is an MTJ sensor that has been designed to be responsive to magnetic fields applied in the Z-direction. Generally, MJ sensors are composed of a minimum of three important layers, which can be referred to as the free layer (FL), the pinned layer (PL), and a tunnel barrier. The FL and PL are composed of ferromagnetic alloys of various elements, including but not limited to Ni, Fe, Co, Al, B, Mo, Hf, Pd, Pt, and Cu. The magnetization of the PL is rigidly held in place and does not vary significantly in response to an applied magnetic field, and the magnetization of the FL is free to orient in response to an applied magnetic field. The tunnel barrier is an insulating material is usually an oxide, such as $AlO_x$ or MgO.

MTJ devices exhibit a change in resistance as measured between the PL and FL that is related to the relative orientation of the FL's magnetization direction with respect to the PL's magnetization direction. This is known as tunneling magnetoresistance (TMR). The change in resistance is quantified by a parameter referred to as the TMR ratio.

$$TMR \text{ Ratio} = \frac{R_{AP} - R_P}{R_P} \quad (1)$$

Here $R_{AP}$ is the resistance of the MTJ when the magnetization of the FL and PL are aligned antiparallel to each other, and $R_P$ is the resistance measured when the magnetization of the FL and PL layers is parallel. Generally, $R_{AP}$ is greater than $R_P$, and the resistance varies as the cosine of the angle between the magnetization of the PL and FL layers.

Figure 2:
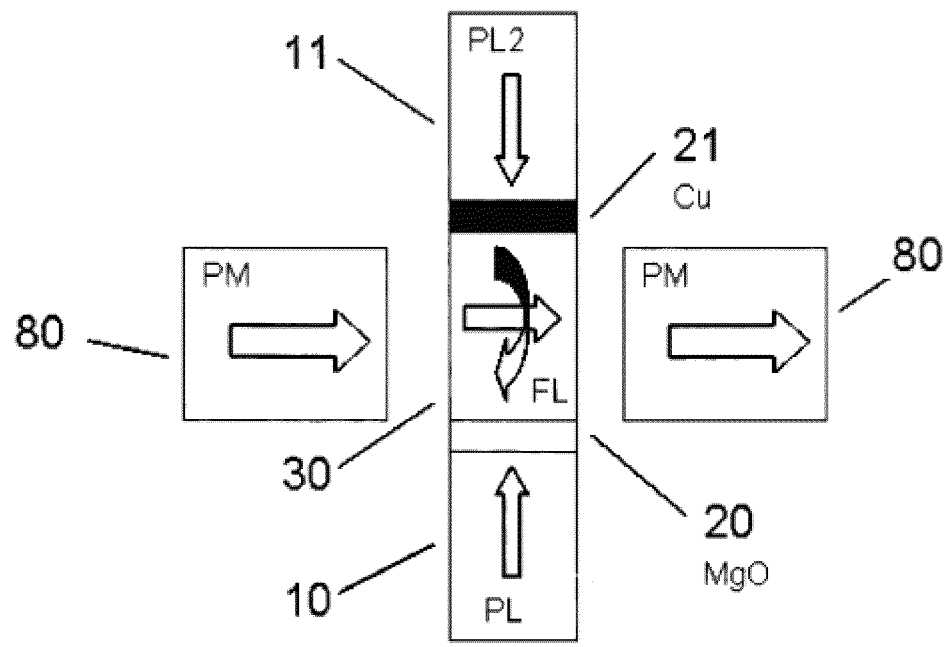
FIG. 2—Schematic drawing of an exemplary MTJ field sensor material layering sequence in which a permanent magnetic is used to control the characteristics of the sensor response. Here the PL magnetization is fixed perpendicular to the plane of the film, and the FL is free to move between the perpendicular and parallel directions. With this orientation of the PL magnetization, the sensor detects the out-of-plane component of the FL magnetization. A second PL may be added with magnetization oriented to control the centering of the resistance as a function of applied magnetic field curve.

A schematic drawing of the preferred sequence of layers in a MTJ device is shown in FIG. 2. The preferred device has an FL 30 that has a PL located adjacent to it on both sides. The top and bottom PLs, PL1 11 and PL 10, have their magnetization set in opposite orientations for the purpose of cancelling stray field produced by the PL layers on the FL layer that might cause asymmetry in the magnetic response of the MTJ device. In order to make the MTJ device responsive to magnetization in the Z-direction, the PLs are magnetized along the Z-axis, and additionally, the spacer layers 20, 21 separating the PLs from the FL 30, are composed of different materials. In the preferred embodiment, one spacer layer 20 is composed of MgO, and the other 21 is composed of Cu. MgO generally exhibits a much larger MR Ratio than devices built using a Cu spacer layer, so the change in resistance of the MTJ device reflects the relative magnetization angular difference between the PL 10 and FL 20. If the spacers were both composed of the same material, the increase in resistance across one spacer layer would compensate the decrease across the other, and the net magnetoresistance of the MTJ sensor device would be very small. The PM layers 80 are used to provide a magnetic bias on the FL 30 that reduces hysteresis and linearizes the response of the MR of the device to an applied magnetic field by helping to keep the FL 30 free of magnetic domains.

Figure 3:
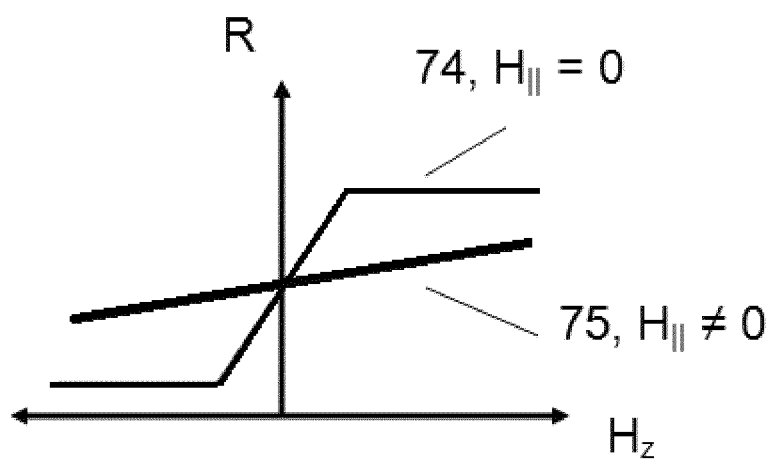
FIG. 3—A plot showing the effect of parallel fields on resistance of the perpendicular anisotropy MTJ device.

The resistive response of the MTJ device to an applied magnetic field is shown in FIG. 3. The horizontal axis of the plot represents magnitude of the magnetic field applied along the Z-axis. The vertical axis represents the tunnel magnetoresistance across the insulating spacer layer. Curve 74 shows the expected variation of the resistance when there is no field applied in the XY plane. Line 75 shows the effect of applying a field in the XY plane, which is to decrease the slope of the linear region of the $R(H_z)$ curve. This cross-axis sensitivity is a function of device geometry and materials. It may be increased or decreased to some extent to suit the sensor design requirements.

The magnetization of the FL 30 generally prefers to orient parallel to a direction that is called the magnetic easy-axis. The orientation of this axis is dependent on magnetic anisotropy, which has contributions due to intrinsic anisotropy of the ferromagnetic materials $K_i$, and shape anisotropy, $K_s$, which as the name of the term implies, is related to the geometry of the FL layer. The total anisotropy of the FL is equal to the sum of the intrinsic and shape contributions:

$$K=K_i+K_s \qquad (2)$$

There are other sources of magnetic anisotropy that could be used to advantage in this device, including surface and stress anisotropy, but for simplicity of the discussion, they will be ignored. The K value varies with orientation of the FL magnetization, and the easy axis is the axis along which K is a minimum.

$K_s$ is small when the magnetization is oriented along the longest directions of the FL, thus the magnetization of the FL due to $K_s$ would be expected to lie in the XY plane in the absence of large fields along the Z-axis. If the FL is patterned into an ellipse, the magnetization would be expected to lie along the long axis of the FL in the XY plane.

In order to make the magnetization prefer to align out of plane, $K_i$ needs to have a large in-plane value that compensates the out of plane $K_s$. This results in an easy-axis that is in the out of plane direction, it is thus often referred to as perpendicular anisotropy. Alloys containing Ni, Co, Fe, Pt, Pd, and Tb are often used to produce this perpendicular anisotropy in thin films. Binary allows such as CoPt, FePt, and CoPd are the most commonly used. It is also possible to induce a surface anisotropy that favors magnetization alignment perpendicular to the surface of the FL, and this has been accomplished in very thin films of CoFeB with various capping layers, such as Ta.

For linear operation as a magnetic field sensor, it is preferred to have $K_i$ slightly less than $K_s$, so that the FL magnetization prefers to align in plane, but moderate values of a magnetic field applied along the out of plane direction, $H_z$, can cause the magnetization to rotate out of plane.

Using perpendicular anisotropy materials and by varying the shape of the sensors, it is possible to make different sensors on the same substrate that respond to different components of the applied field. If the PL magnetization is set in the XY plane, then the MTJ will be sensitive to FL magnetization components parallel to the XY plane. As the FL magnetization is rotated out of plane by $H_z$, the resistance approaches an intermediate value. As it rotates in plane parallel or anti-parallel to the PL magnetizations direction, the resistance approaches a minimum or a maximum.

Alternatively, if the PL magnetization is set in the Z direction, then the sensor will be most strongly sensitive to FL magnetization components along the Z-axis. Additionally, the shape of the FL can be used to make the magnetization rotate more in response to a field along one in-plane axis, say the X-axis, than another axis, say the Y-axis. This effect can be used to cause the sensor to be more responsive to magnetic fields applied along one in-plane axis than another. Finally, the sensor can be designed so that it is round or biased in such a way using a permanent magnetic so that it is equally sensitive to fields applied in the XY plane, but most strongly responsive to fields applied along the Z-axis.

Figure 4:
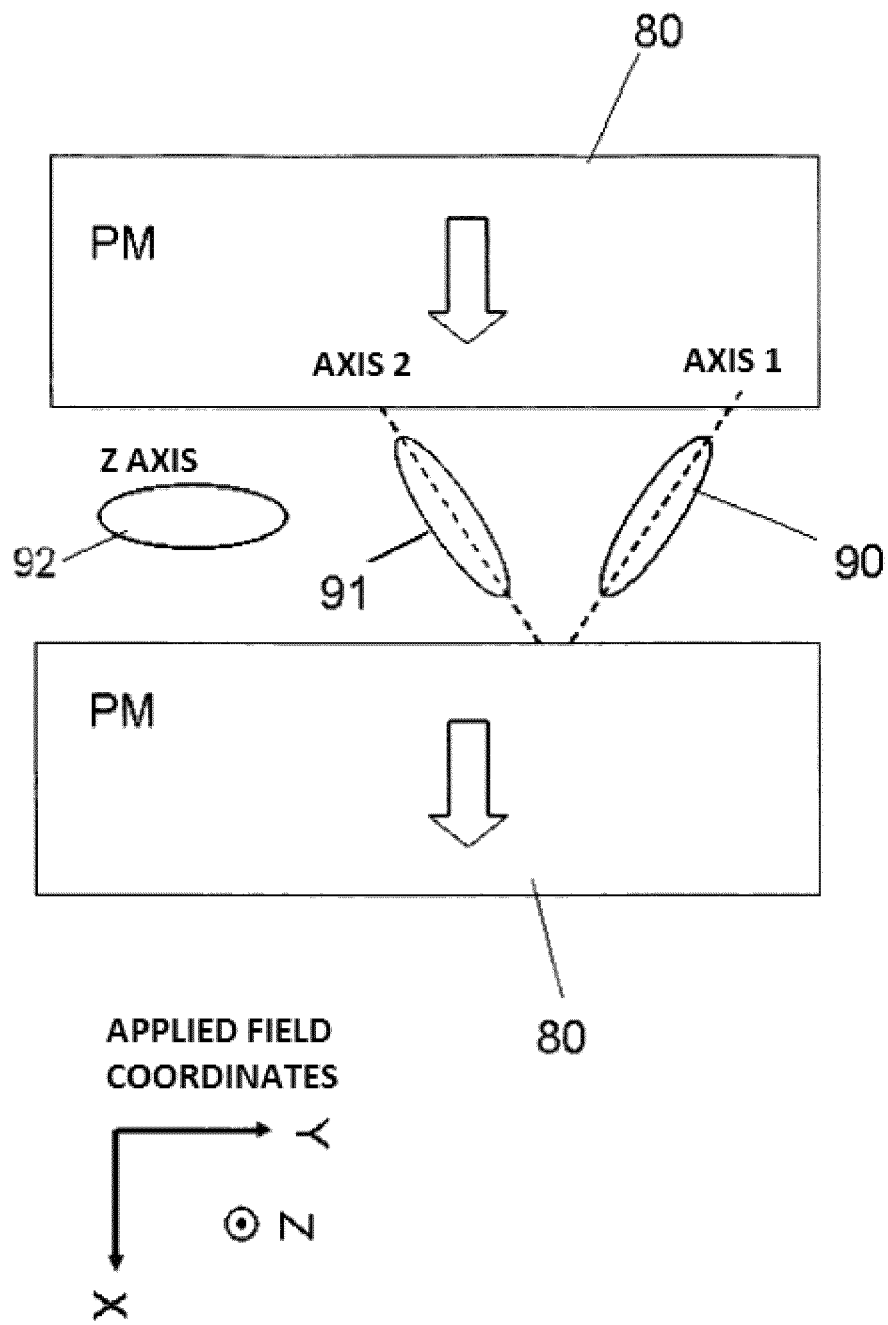
FIG. 4—A schematic drawing of a layout for a multi-axis sensor composed of several perpendicular anisotropy MTJ sensor elements of varying shapes.

In any case, it is apparent that using the same sensor film deposited on a substrate, it is possible to pattern neighboring MTJ sensors into shapes that have different response to the different components of an applied magnetic field. This feature can be used to build a single chip vector magnetometer. A schematic drawing of a single chip magnetometer concept is shown in FIG. 4. Here three different sensor shapes each of which responds most strongly to one of the three preferred components of the applied magnetic field are patterned into the MTJ film. One sensor 90 is most sensitive to magnetic fields applied along axis 1 and another sensor 91 is more sensitive to magnetic fields applied along axis 2. A magnetic field is applied using permanent magnets 80 to bias the in-plane sensors 90 and 91 for low hysteresis operation, and to compensate the Z-sensor 92 so that it is equally responsive to magnetic fields applied in the XY plane.

Figure 5:
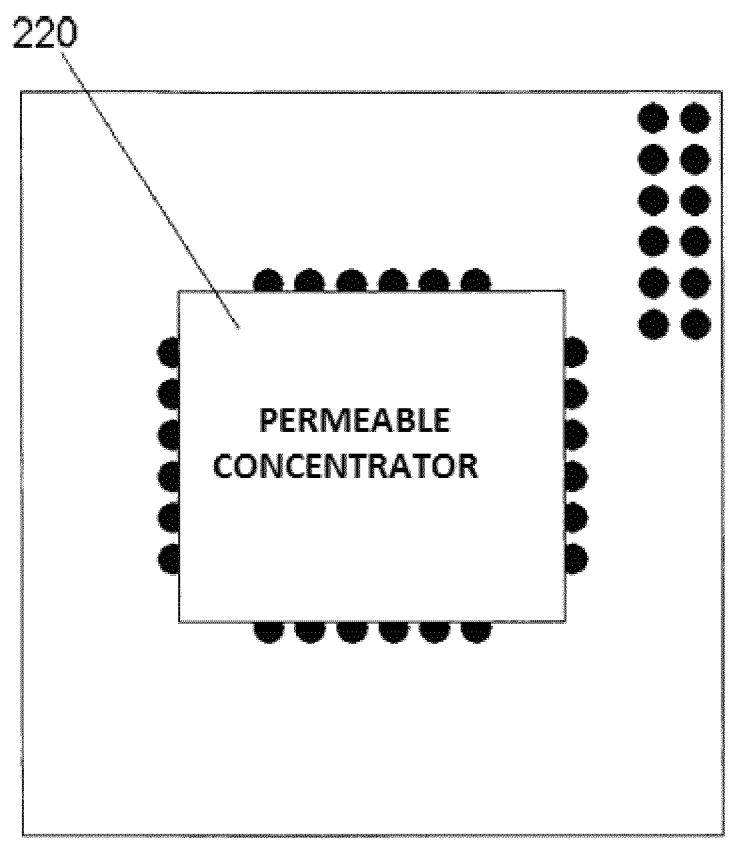
FIG. 5—A schematic drawing of a layout for a multi-axis sensor composed of several perpendicular anisotropy MTJ sensor elements. Sensors are arranged around a permeable ferromagnetic plate in order to separate the applied magnetic field into three different components.
Figure 6:
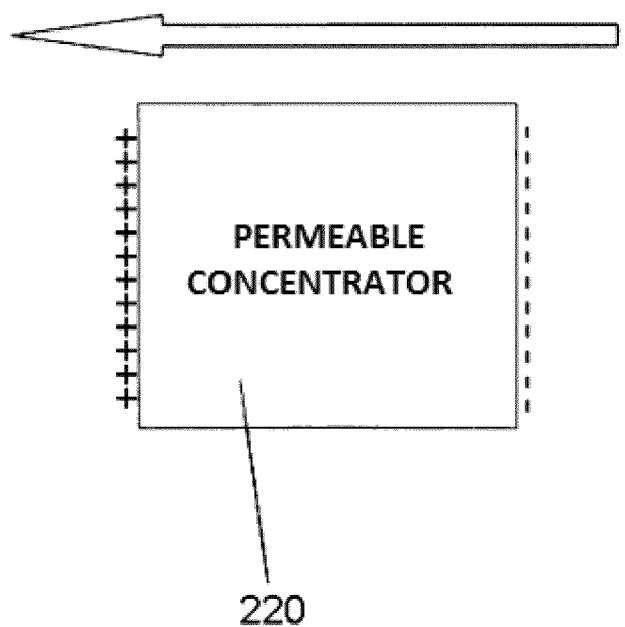
FIG. 6—Illustration of manner in which magnetic poles form around a square plate in an applied magnetic field.
Figure 7:
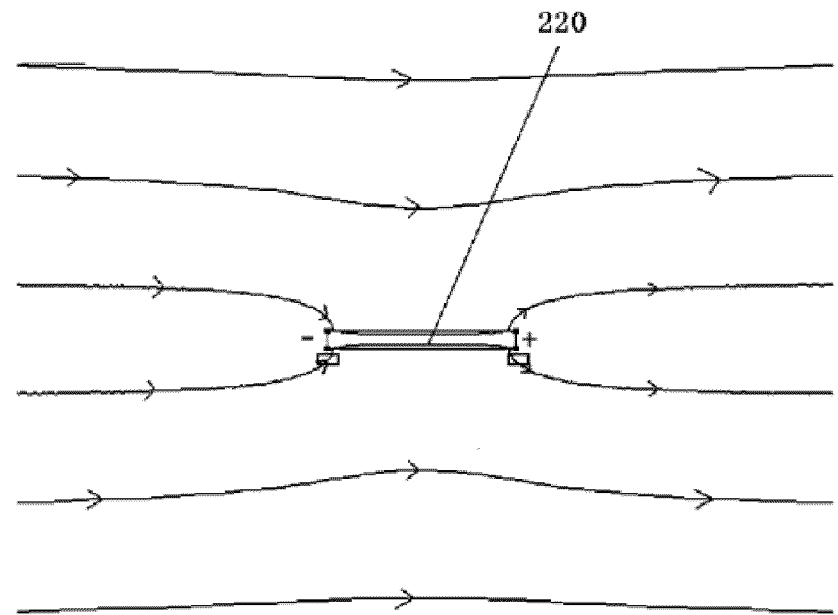
FIG. 7—Method by which in-plane magnetic fields are transformed into perpendicular magnetic fields near the induced magnetic poles of the concentrator. The schematic is across section of the concentration along the applied field direction.

FIG. 5 illustrates another design concept for building a vector magnetometer using perpendicular anisotropy in MTJ devices. In this case, the sensor includes a square high permeability ferromagnetic plate 220, which disturbs the applied magnetic field and changes the direction of the applied magnetic field near the edges of the plate. This is because the permeable concentrator 220 magnetically polarizes in response to the applied field and at least in a mathematical description of the problem, forms the equivalent of magnetic poles at the ends of the plate where the magnetic field enters and leaves the plate as shown in FIG. 6. The strength of the magnetic poles is linearly proportional to the applied in-plane magnetic field. FIG. 7 shows a XZ cross-section of the permeable concentrator 220 when a field is applied along the X direction. Note that the applied field is steered in the upward direction on the left-hand side of permeable concentrator 220, and downward on the right-hand side of permeable concentrator 220. Z-axis magnetic field sensors placed at the left and right hand sides of the permeable concentrator will thus show opposite changes in resistance to fields applied in plane. The difference between the resistance values of the two sensors at opposite sides of the permeable concentrator 220 is thus indicative of the x-axis field, and it should be insensitive to fields applied along the Z and Y directions. Thus the configuration of sensor shown in FIG. 5 should be useful for isolating different components of the applied magnetic field.

Figure 8:
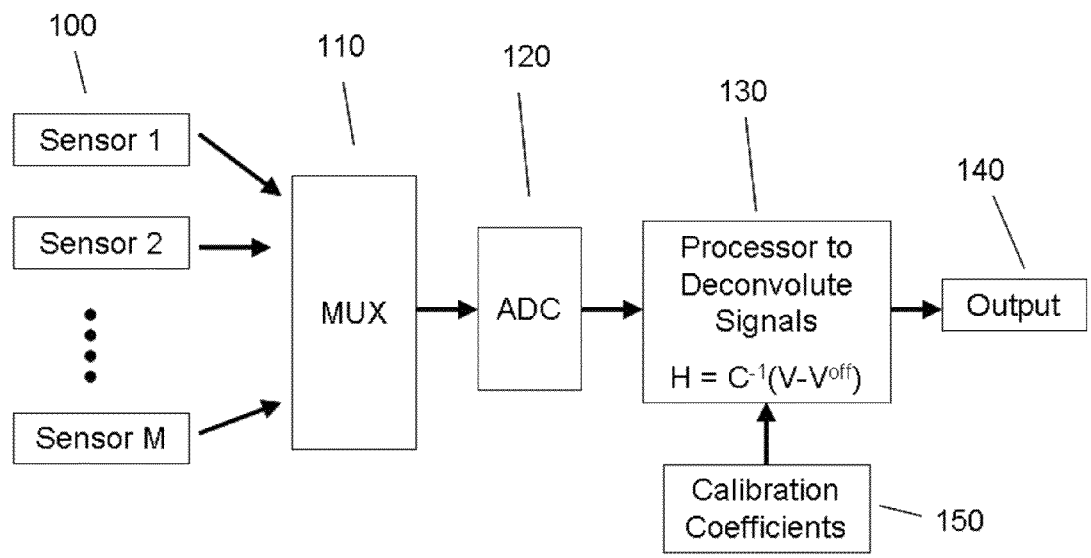
FIG. 8—A schematic drawing of an electronic system used to transform the response of the sensor system into three orthogonal components.

Neither vector magnetometer concept illustrated in FIGS. 4 and 5 are expected to perfectly isolate the different magnetic field components, and there will be cross-axis sensitivity in each of the different sensors to components that are not along the intended sensitivity axis. In order to resolve this problem, and also to overcome any non-orthogonality between the sensitivity axes, a sensor system such as depicted in FIG. 8 can be constructed.

The operating principle for the vector magnetometer system involves treating the voltage output from each of different sensors as a sum of three polynomials of the different field directions $H_x$, $H_y$, and $H_z$ along with a DC offset voltage. The following form is suggested:

$$V_1 - V_1^{\text{off}} = C_{11}{}^x H_x + C_{11}{}^y H_y + C_{11}{}^z H_z + C_{12}{}^x H_x{}^2 + C_{12}{}^y H_y{}^2 + C_{12}{}^z H_z{}^2 + \quad (3)$$

The entire system of equations is then $$V_i - V_i^{\text{off}} = \sum_{j=1}^{N} \sum_{k=x}^{z} C_{ij}^k H_k^j \quad (4)$$

$$\ldots$$

$$V_M - V_M^{\text{off}} = \sum_{j=1}^{N} \sum_{k=x}^{z} C_{Mj}^k H_k^j. $$

Here 'M' is the number of sensors in the array, and 'N' represents the number of terms used in the polynomial to fit the sensor response. The system can be represented as a matrix equation.

$$V - V^{\text{off}} = C H \quad (5)$$

The equation can be inverted to find the H matrix, the desired components of the applied field.

$$H = C^{-1}(V - V^{\text{off}}) \quad (6)$$

For simplicity, consider a two axis sensor designed to detect $H_x$ and $H_y$. Assuming linear response, the outputs of the two sensors required for the system would be described as follows:

$$V_1 - V_1^{\text{off}} = C_{11}{}^x H_x + C_{11}{}^y H_y \quad (7A)$$

$$V_2 - V_2^{\text{off}} = C_{21}{}^x H_x + C_{21}{}^y H_y \quad (7B)$$

As a matrix this is $$\begin{pmatrix} V_1 - V_1^{\text{off}} \\ V_2 - V_2^{\text{off}} \end{pmatrix} = \begin{pmatrix} C_{11}^x & C_{11}^y \\ C_{21}^x & C_{21}^y \end{pmatrix} \begin{pmatrix} H_x \\ H_y \end{pmatrix} \quad (8)$$

The solution for H is then given as $$\begin{pmatrix} H_x \\ H_y \end{pmatrix} = \begin{pmatrix} C_{21}^x & -C_{11}^y \\ -C_{21}^x & C_{11}^y \end{pmatrix} \begin{pmatrix} V_1 - V_1^{\text{off}} \\ V_2 - V_2^{\text{off}} \end{pmatrix} \quad (9)$$

Equation 9 could easily be solved by an on-chip microcontroller using stored values of the C and $V^{\text{off}}$ coefficients. The C and $V^{\text{off}}$ matrix components can be determined by placing the sensor array in a calibration fixture and measuring $V(H_x, H_y)$ for each sensor at sufficient number of $(H_x, H_y)$ points in order to fit the response to equation 7.

If the sensor response in also nonlinear in addition to showing cross-axis response, then higher order terms in the polynomial can be retained, but for each term retained, the number of sensors used in the array must be doubled. If for example, it is necessary to include $H^3$ in the fit polynomial for the sensors, then the following system needs to be inverted to find the field components of a two axis-sensor:

$$\begin{pmatrix} V_1 - V_1^{\text{off}} \\ V_2 - V_2^{\text{off}} \\ V_3 - V_3^{\text{off}} \\ V_4 - V_4^{\text{off}} \end{pmatrix} = \begin{pmatrix} C_{11}^x & C_{11}^y & C_{13}^x & C_{13}^y \\ C_{21}^x & C_{21}^y & C_{23}^x & C_{23}^y \\ C_{31}^x & C_{31}^y & C_{33}^x & C_{33}^y \\ C_{41}^x & C_{41}^y & C_{43}^x & C_{43}^y \end{pmatrix} \begin{pmatrix} H_x \\ H_y \\ H_x^3 \\ G_y^3 \end{pmatrix} \quad (10)$$

Then in this case, 20 parameters will need to be stored for inverting the equation. By analogy, the equation can be extended to include up to three orthogonal axes and as many polynomial terms as can be practically stored on chip. The minimum size of the storage area on chip is then $$\text{MemSize} = \text{Axes}^N (\text{Axes}^N + 1). \quad (11)$$

Where again, N is the number of terms used in the polynomial for each H component.

A representative on-chip computation system for inverting the system equation for an array of sensors and mapping the voltage output from the array of sensors into orthogonal magnetic field components is shown in FIG. 8. Here, the array of M sensors 100 is periodically selected and sampled using an analog multiplexer 110 and analog to digital converter (ADC) 120. The output from the ADC is fed into a microcontroller 130 that is used compute the magnetic field values from the array of voltage values. The microcontroller uses calibration data that is stored in on-chip memory 150. The microcontroller provides output in digital format 140. The system may be designed so that it is calibrated at wafer level, and so it can be recalibrated by the end-user through a special calibration mode.

It will be apparent to those skilled in the art that various modifications can be made to the proposed invention without departing from the scope or spirit of the invention. Further, it is intended that the present invention disclosure cover modifications and variations of the proposed invention provided that such modifications and variations come within the scope of the appended claims and their equivalence.

What is claimed is:

1. A thin-film magnetoresistive sensor element for detecting a magnetic field component perpendicular to a plane of a substrate of its deposition, comprising:
   a ferromagnetic free layer in which an intrinsic easy axis of a material of the ferromagnetic free layer is set perpendicular to the plane of the substrate onto which the ferromagnetic free layer is deposited,
   a ferromagnetic reference layer, wherein magnetization of the ferromagnetic reference layer is constrained to lie perpendicular to the plane of the substrate, Wherein the ferromagnetic reference layer comprising a ferromagnetic material with perpendicular anisotropy and shape such that the ferromagnetic reference layer has a higher coercivity than the ferromagnetic free layer,
   a spacer layer between said ferromagnetic free layer and ferromagnetic reference layer, wherein the space layer, comprising either an insulating or a conducting material,
   an electronic system coupled to the array of the sensor element to be used to deconvolute response of the array of the sensor element into a coordinate system describing two or three orthogonal magnetic field directions, and
   wherein each sensor element is deposited on the same substrate, and patterned into a collection of shapes, each of which has a different sensitivity to magnetic fields applied along two or more oblique axes.

2. A thin-film magnetoresistive sensor element as in claim 1, comprising permanent magnets disposed such that they apply a magnetic field parallel to the ferromagnetic free layer in the direction parallel to the plane of the substrate, wherein said magnetic field is applied in order to reduce hysteresis of response of the ferromagnetic free layer to fields applied perpendicular to the plane of the substrate.

3. A thin-film magnetoresistive sensor element for detecting a magnetic field component perpendicular to a plane of a substrate of its deposition, comprising:
- a ferromagnetic free layer in which the intrinsic easy axis of a material of the ferromagnetic free layer is set perpendicular to the plane of the substrate onto which it is deposited,
- a first ferromagnetic reference layer in which the magnetization of the first ferromagnetic reference layer is constrained to lie perpendicular to the plane of the substrate, wherein the first ferromagnetic reference layer comprising a ferromagnetic material with perpendicular anisotropy and shape such that the first ferromagnetic reference layer has a higher coercivity than the ferromagnetic free layer,
- a spacer layer between said ferromagnetic free layer and the first ferromagnetic reference layer, comprising an insulating material,
- a second reference layer with magnetization oriented in a direction opposite to that of the first ferromagnetic reference layer, wherein the second reference layer comprising a ferromagnetic material with perpendicular anisotropy and shape such that the second reference layer has a higher coercivity than the free layer,
- a spacer layer between the ferromagnetic free layer and the second reference layer, comprising a conducting material,
- an electronic system coupled to the array of the sensor element to be used to deconvolute response of the array of the sensor element into a coordinate system describing two or three orthogonal magnetic field directions, and
- wherein each sensor element is deposited on the same substrate, and patterned into a collection of shapes, each of which has a different sensitivity to magnetic fields applied along two or more oblique axes.

4. A thin-film magnetoresistive sensor element as in claim 3, comprising permanent magnets disposed such that they apply a magnetic field parallel to the ferromagnetic free layer in the direction parallel to the plane of the substrate; said magnetic field is applied in order to reduce hysteresis of the response of the ferromagnetic free layer to fields applied perpendicular to the plane of the substrate.

5. An array of the sensor element as in claim 1, wherein each sensor element is deposited on the same substrate, and arranged in various positions around a permeable ferromagnetic plate in order to separate an applied magnetic field into different components.

6. An array of the sensor element as in claim 5, wherein an electronic device is coupled to the array of sensor element to be used to deconvolute the response of the various sensor elements into a coordinate system with three orthogonal directions.

7. An array of the sensor element as claimed in claim 3, wherein each sensor element is deposited onto the same substrate and arranged in different positions around a circumference of a high magnetic permeability ferromagnetic plate in order to separate an applied magnetic field into different components.

8. An array of the sensor elements as claimed in claim 7, wherein the array of the sensor element are connected to an electronic apparatus that is used to deconvolute the response of the various sensor elements into three orthogonal coordinates.

* * * * *